United States Patent
Imhof (10) Patent No.: US 12,429,511 B2
(45) Date of Patent: Sep. 30, 2025

(54) ELECTROMETER WITH OPTICAL Rydberg FREQUENCY TUNING

(71) Applicant: NORTHROP GRUMMAN SYSTEMS CORPORATION, Falls Church, VA (US)

(72) Inventor: Eric A. Imhof, Albuquerque, NM (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 178 days.

(21) Appl. No.: 18/465,040

(22) Filed: Sep. 11, 2023

(65) Prior Publication Data

US 2024/0085467 A1     Mar. 14, 2024

Related U.S. Application Data

(60) Provisional application No. 63/406,561, filed on Sep. 14, 2022.

(51) Int. Cl.
*G01R 29/08* (2006.01)
*G01R 29/12* (2006.01)

(52) U.S. Cl.
CPC ......... *G01R 29/0885* (2013.01); *G01R 29/12* (2013.01)

(58) Field of Classification Search
CPC .............................. G01R 29/12; G01R 29/0885
USPC ....................................................... 324/457
See application file for complete search history.

(56) References Cited

U.S. PATENT DOCUMENTS

| | | | | |
|---|---|---|---|---|
| 4,147,979 | A | * | 4/1979 | Baues ..................... G01R 29/12 385/12 |
| 2016/0036361 | A1 | | 2/2016 | Sullivan et al. |
| 2016/0363617 | A1 | * | 12/2016 | Anderson .......... G01R 29/0885 |
| 2019/0072600 | A1 | * | 3/2019 | Schubert ............... H01S 5/0657 |
| 2020/0029583 | A1 | | 1/2020 | Garwood |
| 2021/0027088 | A1 | | 1/2021 | Dai |
| 2022/0019671 | A1 | | 1/2022 | Boone et al. |

OTHER PUBLICATIONS

WOISR—International Search Report & Written Opinion mailed Jan. 8, 2024 for corresponding PCT/US2023/032490.

* cited by examiner

*Primary Examiner* — Christopher P McAndrew
(74) *Attorney, Agent, or Firm* — Tarolli, Sundheim, Covell &Tummino LLP (57) ABSTRACT

One embodiment includes an electrometer system. The system includes a sensor cell comprising alkali metal atoms within, and an optical beam system configured to provide at least one optical beam through the sensor cell to provide a first Rydberg energy state of the alkali metal atoms, the at least one optical beam exiting the sensor cell as a detection beam. The system also includes a tuning laser configured to generate a tuning beam having a predetermined tuning frequency between the first Rydberg energy state and an intermediate energy state of the alkali metal atoms. The system further includes a detection system configured to monitor the detection beam to detect an external signal having a frequency that is approximately equal to an energy difference between the first Rydberg energy state and a second Rydberg energy state based on monitoring the detection beam.

20 Claims, 4 Drawing Sheets

ELECTROMETER WITH OPTICAL Rydberg FREQUENCY TUNING

RELATED APPLICATIONS

This application claims priority from U.S. Patent Application Ser. No. 63/406,561, filed 14 Sep. 2022, which is incorporated herein by reference in its entirety.

TECHNICAL FIELD

The present invention relates generally to sensor systems, and specifically to an electrometer with optical Rydberg frequency tuning.

BACKGROUND

Electric field measurement via electrometers has many useful applications. Detectable electric fields can include DC electric fields, as well as AC electric fields (e.g., radio frequency (RF) fields which can correspond to communications signals). The detection of electric fields can be implemented for anti-spoofing and/or anti-jamming capability in electronic warfare environments. For example, if a jamming or spoofing signal can be detected, then the jamming signal or spoofing signal can be filtered or demodulated out to provide for a baseband signal of interest without undesired or adversarial interference. As an example, multiple antennas arranged in an array can provide for directional detection of a signal, such as to provide a detectable directional of a source of the signal.

SUMMARY

One embodiment includes an electrometer system. The system includes a sensor cell comprising alkali metal atoms within, and an optical beam system configured to provide at least one optical beam through the sensor cell to provide a first Rydberg energy state of the alkali metal atoms, the at least one optical beam exiting the sensor cell as a detection beam. The system also includes a tuning laser configured to generate a tuning beam having a predetermined tuning frequency between the first Rydberg energy state and an intermediate energy state of the alkali metal atoms. The system further includes a detection system configured to monitor the detection beam to detect an external signal having a frequency that is approximately equal to an energy difference between the first Rydberg energy state and a second Rydberg energy state based on monitoring the detection beam.

Another example includes a method for detecting an external signal via an electrometer system. The method includes providing a probe beam through a sensor cell comprising alkali metal atoms. The probe beam can exit the sensor cell as a detection beam. The method also includes providing a coupling beam through the sensor cell to excite the alkali metal atoms from a ground state to a first Rydberg energy state of the alkali metal atoms based on the probe beam and the coupling beam. The method also includes providing a tuning beam having a predetermined tuning frequency through the sensor cell. The predetermined tuning frequency can be approximately equal to an energy difference between the first Rydberg energy state and an intermediate energy state of the alkali metal atoms. The method further includes monitoring the detection beam to detect the external signal having a frequency that is approximately equal to an energy difference between the first Rydberg energy state and a second Rydberg energy state.

Another example includes an electrometer system. The system includes a sensor cell comprising alkali metal atoms within and a probe laser configured to generate a probe beam directed through the sensor cell in a first direction, the probe beam exiting the sensor cell as the detection beam. The system also includes a coupling laser configured to generate a coupling beam directed through the sensor cell collinearly and anti-parallel with the probe beam to provide a first Rydberg energy state of the alkali metal atoms. The system also includes a tuning laser configured to provide a tuning beam through the sensor cell. The tuning beam can have a predetermined tuning frequency between the first Rydberg energy state and an intermediate energy state of the alkali metal atoms. The system further includes a detection system configured to monitor the detection beam to detect an external signal having a frequency that is approximately equal to an energy difference between the first Rydberg energy state and a second Rydberg energy state based on monitoring the detection beam.

DETAILED DESCRIPTION

The present invention relates generally to sensor systems, and specifically to an electrometer with optical Rydberg frequency tuning. The electrometer system can include a sensor cell containing a vapor of alkali metal atoms enclosed within. The electrometer system also includes a probe laser and a coupling laser that are configured to generate a probe beam and a coupling beam, respectively. Each of the probe beam and the coupling beam can be provided through the sensor cell via a set of optics. The probe beam and coupling beams can take any mutually intersecting path through the sensor cell, including but not limited to paths in which the probe beam and the coupling beams are arranged collinearly and anti-parallel with each other. The probe beam may exit the sensor cell traveling in the opposite direction as the coupling beams. After exiting the sensor cell, the probe beam can be isolated and interrogated as a detection beam. The probe beam and the coupling beam can be tuned to respective frequencies and powers to excite certain atoms within the alkali metal vapor to a first Rydberg energy state. The number and properties of atoms in this first Rydberg energy state can be determined by measuring the power and phase of the detection beam. For example, if the power of the detection beam plotted as a function of detection beam frequency, a peak of transmitted light can be detected for frequencies corresponding to the excitation of the first Rydberg energy state.

The electrometer system also includes a tuning laser configured to generate a tuning beam that is likewise provided through the sensor cell. As an example, the tuning beam can be provided collinearly through the sensor cell with respect to the probe beam and the coupling beam. The tuning beam can have a frequency that corresponds to an energy difference between the first Rydberg energy state and an intermediate energy state. The intermediate energy state is selected from the available states not used during initial excitation of the first Rydberg state, and can be significantly lower in energy than the first Rydberg energy state. The tuning beam can mix the first Rydberg energy state and the intermediate energy state, thereby creating a pair of mixed energy states. The mixed energy states can each be based on a combination of the first Rydberg energy state and the intermediate energy state (e.g., based on a sum and difference of the first Rydberg energy state and the intermediate energy state, as modified by a coefficient). The mixed energy states can correspond to a pair of Autler-Townes frequency-spectrum transparency peaks associated with the alkali metal atoms.

The electrometer system further includes a detection system configured to monitor the detection beam to detect an external signal having a frequency that is approximately equal to an energy difference between the first Rydberg energy state and a second Rydberg energy state. The detection system can include a photodetector that can monitor an intensity and/or phase of the detection beam. For example, the resonance of the tuning beam to the energy difference between the first Rydberg state and the intermediate energy state can result in generation of a pair of mixed energy states that are associated with the first Rydberg energy state. The mixed energy states can each be based on a combination of the first Rydberg state and the intermediate energy state (e.g., based on a sum and difference of the first Rydberg state and the intermediate energy state, as modified by a coefficient). The mixed energy states can correspond to a pair of Autler-Townes frequency-spectrum transparency peaks associated with the alkali metal atoms.

As an example, the tuning beam can be adjusted (e.g., by frequency and/or intensity) to adjust the energy of the pair of mixed energy states, such that one of the mixed energy states can be adjusted relative to the second Rydberg energy state to be approximately equal to the frequency of the external signal. Therefore, in response to the energy difference between the respective one of the mixed energy states and the second Rydberg energy state being approximately equal to the frequency of the external signal, the detection system can determine a change in the pair of Autler-Townes frequency-spectrum transparency peaks that corresponds to the presence of the external signal. Therefore, by being able to tune the energy of the mixed energy states relative to the second Rydberg energy state, the electrometer system can be tuned to detect an external signal having substantially any frequency based on discrete Rydberg energy states. Accordingly, the electrometer system can be tuned to detect an external signal via an optical signal, as opposed to a radio frequency (RF) signal that can exhibit non-uniformity of frequency in the sensor cell. The non-uniformity of the frequency of the RF signal in a typical atomic electrometer can provide for uneven energy adjustment of the alkali metal atoms in the sensor cell, resulting in detection errors. However, by implementing optical tuning using the tuning beam, the energy of the alkali metal atoms can be adjusted uniformly through the sensor cell to exhibit a more accurate detection of the external signal.

Figure 1:
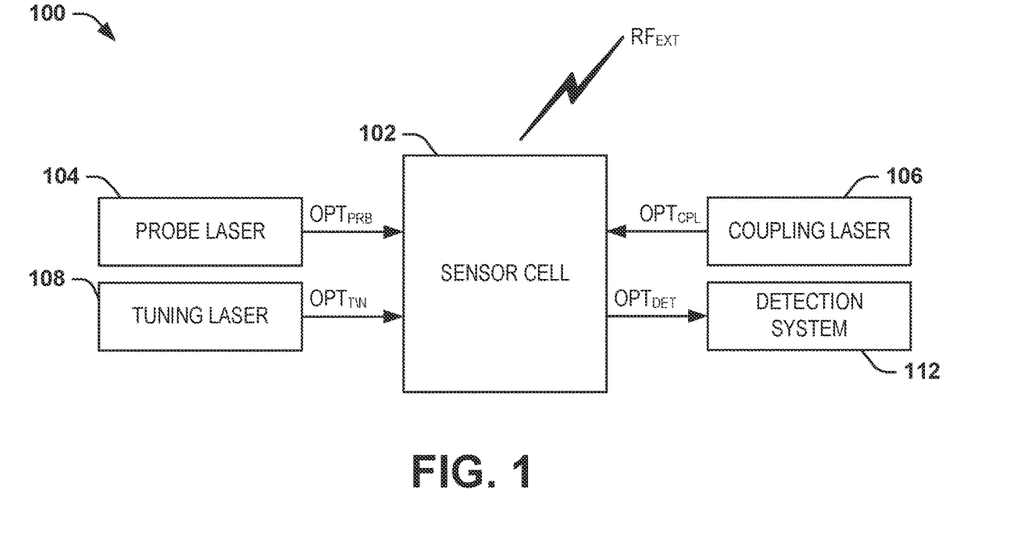
FIG. 1 illustrates an example diagram of an electrometer system.

FIG. 1 illustrates an example diagram of an electrometer system 100. The electrometer system 100 can be implemented in any of a variety of applications, such as to detect an external electromagnetic signal of any frequency (e.g., a radio frequency (RF) signal). In the example of FIG. 1, the external signal is demonstrated as $RF_{EXT}$.

The electrometer system 100 includes a sensor cell 102 that can be configured as a sealed glass container that includes a vapor of alkali metal atoms. As an example, the alkali metal vapor can be rubidium (Rb), or any of a variety of other types of alkali metals (e.g., cesium (Cs)). As described herein, the alkali metal vapor can be excited to a Rydberg energy state, such that the alkali metal vapor can be substantially insensitive to absorption of photons of light of a specific frequency (e.g., is approximately transparent). The electrometer system 100 also includes a probe laser 104 that is configured to generate a probe beam $OPT_{PRB}$ and a coupling laser 106 that is configured to generate a coupling beam $OPT_{CPL}$. As an example, each of the probe beam $OPT_{PRB}$ and the coupling beam $OPT_{CPL}$ can be provided through the sensor cell 102 via optics (not shown) in a manner such that the probe beam $OPT_{PRB}$ and the coupling beam $OPT_{CPL}$ can each be collimated (e.g., via optics) and provided collinearly and anti-parallel with respect to each other. However, other arrangements for providing intersection of the probe beam $OPT_{PRB}$ and the coupling beam $OPT_{CPL}$ for stimulating the alkali metal vapor to the Rydberg state can be provided instead.

As an example, the probe beam $OPT_{PRB}$ and the coupling beam $OPT_{CPL}$ can be tuned to respective frequencies to provide a first Rydberg energy state of the alkali metal vapor, such that the alkali metal vapor is excited to populate the first Rydberg energy state. While the example of FIG. 1 demonstrates a single coupling laser 106, multiple coupling lasers can be implemented to provide multiple respective coupling beams $OPT_{CPL}$ of differing frequencies to excite the alkali metal vapor to the first Rydberg energy state, as described herein. Therefore, by implementing multiple coupling beams $OPT_{CPL}$ of differing frequencies, the first Rydberg energy state can be selected to provide a greater angular momentum of the alkali metal vapor. The probe beam $OPT_{PRB}$ can exit the sensor cell 102 as a detection beam $OPT_{DET}$.

The electrometer system 100 also includes a tuning laser 108 configured to generate a tuning beam $OPT_{TN}$ that is likewise provided through the sensor cell 102. As an example, the tuning beam $OPT_{TN}$ can be provided collinearly through the sensor cell 102 with respect to the probe beam $OPT_{PRB}$ and the coupling beam $OPT_{CPL}$. The tuning beam $OPT_{TN}$ can be selected to have a frequency that corresponds to an approximate energy difference between the first Rydberg energy state and an intermediate energy state. As an example, the intermediate energy state can have an energy that is significantly less than the first Rydberg energy state. Therefore, the tuning beam $OPT_{TN}$ can have a frequency that is resonant with respect to the first Rydberg energy state and the intermediate state.

As described in greater detail herein, the resonance of the tuning beam $OPT_{TN}$ to the energy difference between the first Rydberg state and the intermediate energy state can result in generation of a pair of mixed energy states that are associated with the first Rydberg energy state. The mixed energy states can each be based on a combination of the first Rydberg state and the intermediate energy state (e.g., based on a sum and difference of the first Rydberg state and the intermediate energy state, as modified by a coefficient). As an example, the pair of mixed energy states can be approximately centered on or proximal to the first Rydberg energy state. The mixed energy states can correspond to a pair of Autler-Townes frequency-spectrum transparency peaks associated with the alkali metal atoms.

As an example, the tuning beam $OPT_{TN}$ can be adjusted (e.g., by frequency and/or intensity) to adjust the energy of the pair of mixed energy states, such that one of the mixed energy states can be adjusted relative to a second Rydberg energy state to be approximately equal to the frequency of the external signal $RF_{EXT}$. Therefore, as described herein, the external signal $RF_{EXT}$ can be detected in response to the energy difference between the respective one of the mixed energy states and the second Rydberg energy state being approximately equal to the frequency of the external signal $RF_{EXT}$.

The electrometer system 100 further includes a detection system 110 that is configured to monitor the detection beam $OPT_{DET}$ to detect the external signal $RF_{EXT}$. The detection system 110 can include a photodetector that can monitor an intensity and/or phase of the detection beam $OPT_{DET}$. As described above, the mixed energy states provided by the tuning beam $OPT_{TN}$ can provide a defined pair of Autler-Townes frequency-spectrum transparency peaks associated with the alkali metal atoms in response to the tuning beam $OPT_{TN}$ having a frequency that is approximately equal to the energy difference between the first Rydberg energy state and the intermediate energy state. The detection system 110 can thus determine a change in the pair of Autler-Townes frequency-spectrum transparency peaks that correspond to the presence of the external signal.

For example, in response to one of the mixed energy states being adjusted relative to the second Rydberg energy state to be approximately equal to the frequency of the external signal $RF_{EXT}$, the respective one of the mixed energy states can likewise result in creation of another pair of mixed energy states (e.g., a further Autler-Townes splitting) associated with the respective one of the mixed energy states. The additional Autler-Townes frequency-spectrum transparency peaks can thus be detected by the detection system 110 to detect the external signal $RF_{EXT}$. The detection system 110 can thus determine that the change in the pair of Autler-Townes frequency-spectrum transparency peaks corresponds to the presence of the external signal $RF_{EXT}$. Therefore, by being able to tune the energy of the mixed energy states relative to the second Rydberg energy state, the electrometer system 100 can be tuned to detect the external signal $RF_{EXT}$ having substantially any frequency based on discrete Rydberg energy states.

Accordingly, the electrometer system 100 can be tuned to detect an external signal via an optical signal, the tuning beam $OPT_{TN}$, as opposed to a radio frequency (RF) signal that can exhibit non-uniformity of frequency in the sensor cell. The non-uniformity of the frequency of the RF signal in a typical atomic electrometer can provide for uneven energy adjustment of the alkali metal atoms in the sensor cell, resulting in detection errors. However, by implementing optical tuning using the tuning beam $OPT_{TN}$, the energy of the alkali metal atoms can be adjusted uniformly through the sensor cell 102 to exhibit a more accurate tuning of the electrometer system 100 to detect the external signal $RF_{EXT}$.

Figure 2:
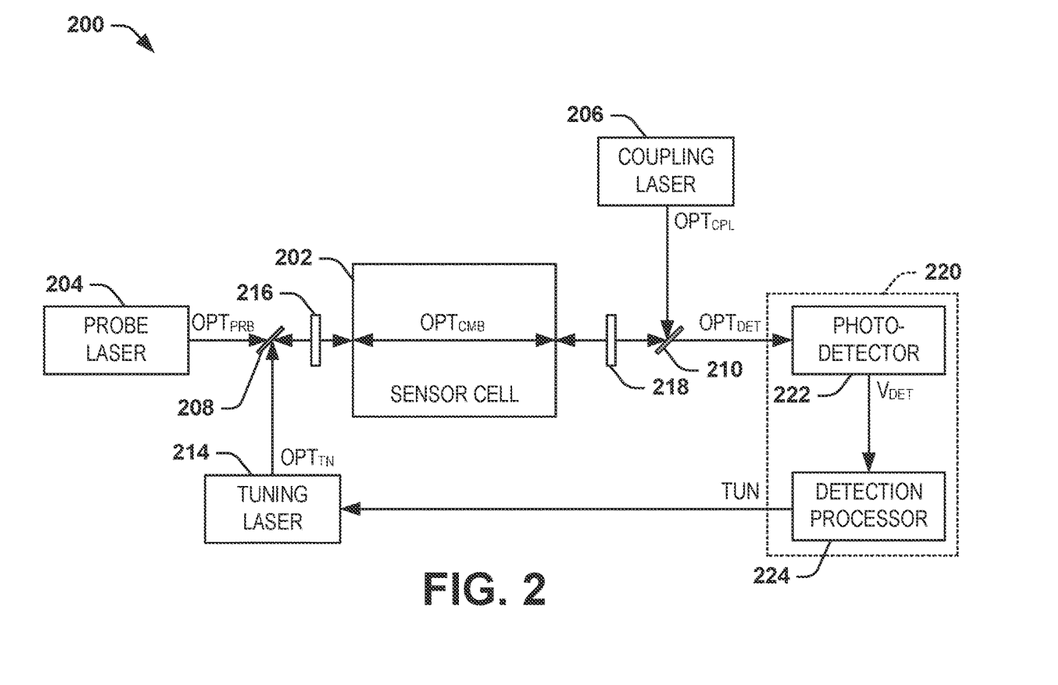
FIG. 2 illustrates another example diagram of an electrometer system.

FIG. 2 illustrates another example diagram of an electrometer system 200. The electrometer system 200 can be implemented in any of a variety of applications in which detection of an external signal $RF_{EXT}$ is desired.

The electrometer system 200 includes a sensor cell 202 that can be configured as a sealed glass container that includes an alkali metal vapor. The electrometer system 200 also includes a probe laser 204 that is configured to generate a probe beam $OPT_{PRB}$ and a coupling laser 206 that is configured to generate a coupling beam $OPT_{CPL}$. The probe beam $OPT_{PRB}$ is provided to a dichroic mirror 208 that is configured to pass the probe beam $OPT_{PRB}$ to provide the probe beam $OPT_{PRB}$ to the sensor cell 202. Similarly, the coupling beam $OPT_{CPL}$ is provided to a dichroic mirror 210 that is configured to reflect the coupling beam $OPT_{CPL}$ into the sensor cell 202 and to pass the probe beam $OPT_{PRB}$ through the dichroic mirror 210 as a detection beam $OPT_{DET}$ that is monitored by a detection system 220. Similarly, the dichroic mirror 208 is configured to pass the coupling beam $OPT_{CPL}$. As described in greater detail herein, the probe beam $OPT_{PRB}$ and the coupling beam $OPT_{CPL}$ can be tuned to respective frequencies to provide a first Rydberg energy state of the alkali metal vapor. While the example of FIG. 2 demonstrates a single coupling laser 206, multiple coupling lasers can be implemented to provide multiple respective coupling beams $OPT_{CPL}$ of differing frequencies to excite the alkali metal vapor to the first Rydberg state, as described herein.

The electrometer system 200 also includes a tuning laser 214 configured to generate a tuning beam $OPT_{TN}$. The tuning beam $OPT_{TN}$ is provided to the dichroic mirror 208 to be reflected to pass through the sensor cell 202. The tuning beam $OPT_{TN}$ can be selected to have a frequency that corresponds to an approximate energy difference between the first Rydberg energy state and an intermediate energy state, as described in greater detail herein. As an example, the intermediate energy state can have an energy that is significantly less than the first Rydberg energy state. In the example of FIG. 2, the tuning laser 204 receives a tuning signal TUN that can be implemented to adjust the tuning beam $OPT_{TN}$ (e.g., by frequency and/or intensity), as described in greater detail herein.

Based on the arrangement of the dichroic mirrors 208 and 210, the probe beam $OPT_{PRB}$, the coupling beam $OPT_{CPL}$, and the tuning beam $OPT_{TN}$ can be provided through the sensor cell 202 in a manner such that the probe beam $OPT_{PRB}$, the coupling beam $OPT_{CPL}$, and the tuning beam $OPT_{TN}$ are collinear, with the coupling beam $OPT_{CPL}$ being anti-parallel with respect to the probe beam $OPT_{PRB}$ and the tuning beam $OPT_{TN}$, demonstrated in the example of FIG. 2 as a beam $OPT_{CMB}$. Additionally, the electrometer system 200 includes collimating optics 216 (e.g., a lens) that can collimate the probe beam $OPT_{PRB}$ and the tuning beam $OPT_{TN}$ along a specific optical axis in the sensor cell 202, and collimating optics 218 (e.g., a lens) that can collimate the coupling beam $OPT_{CPL}$ along the specific optical axis in the sensor cell 202, such that the collimation of each of the probe beam $OPT_{PRB}$, the coupling beam $OPT_{CPL}$, and the tuning beam $OPT_{TN}$ can be provided along the same optical axis in a collinear manner. Alternatively, the electrometer system 200 can include focusing optics to focus each of the probe beam $OPT_{PRB}$, the coupling beam $OPT_{CPL}$, and the tuning beam $OPT_{TN}$ to be collocated in the sensor cell 202 at a measurement point.

Figure 3:
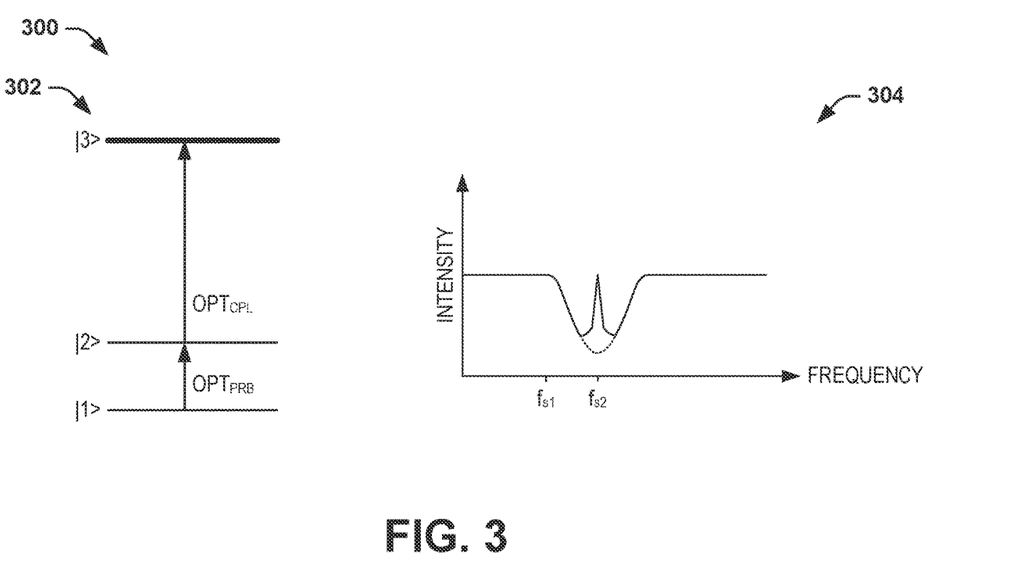
FIG. 3 illustrates an example diagram of optical detection.

FIG. 3 illustrates an example diagram 300 of optical detection. The diagram 300 includes an energy state diagram 302 and a graph 304 that demonstrates intensity of the detection beam $OPT_{DET}$ plotted as a function of frequency. The diagram 300 can correspond to optical detection in the electrometer system 200. Therefore, reference is to be made to the example of FIG. 2 in the following description of the example of FIG. 3.

The energy state diagram 302 demonstrates a first energy state (e.g., ground state) 11> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |3>. Therefore, the alkali metal atoms in the first Rydberg energy state |3> can be transparent with respect to light at the approximate frequency of the probe beam $OPT_{PRB}$.

The graph 304 demonstrates that, at lower frequencies, the intensity of the detection beam $OPT_{DET}$ is at approximately 100%, corresponding to substantially no absorption of photons of the probe beam $OPT_{PRB}$ by the alkali metal vapor. The intensity begins to decrease at a frequency $f_{s1}$ to an absorption peak at a frequency $f_{s2}$ corresponding to maximum absorption of the photons of the probe beam $OPT_{PRB}$ by the alkali metal vapor, and thus a minimum intensity of the detection beam $OPT_{DET}$. The minimum intensity is demonstrated at an inverse peak dotted line in the example of FIG. 3, which would correspond to maximum absorption of the photons of the probe beam $OPT_{PRB}$ absent the coupling beam $OPT_{CPL}$. However, due to the coupling beam $OPT_{CPL}$, provided at a specific frequency and/or polarization with respect to the frequency of the probe beam $OPT_{PRB}$, the alkali metal vapor can experience a Rydberg transition, such that the alkali metal vapor can be substantially insensitive to absorption of the photons of the probe beam $OPT_{PRB}$ at the maximum absorption frequency $f_{s2}$. Therefore, the graph 304 demonstrates an intensity peak at the maximum absorption frequency $f_{s2}$.

Figure 4:
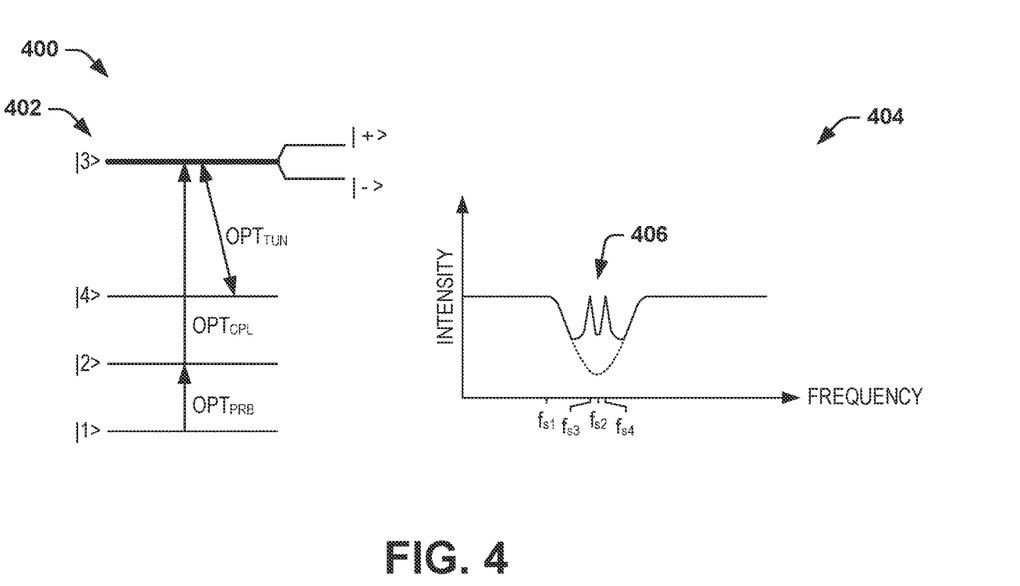
FIG. 4 illustrates another example diagram of optical detection.

FIG. 4 illustrates an example diagram 400 of optical detection. The diagram 400 includes an energy state diagram 402 and a graph 404 that demonstrates intensity of the detection beam $OPT_{DET}$ plotted as a function of frequency. The diagram 400 can correspond to optical detection in the electrometer system 200. Therefore, reference is to be made to the example of FIG. 2 in the following description of the example of FIG. 4.

The energy state diagram 402 is similar to the energy state diagram 302 in the example of FIG. 3. Particularly, the energy state diagram 402 demonstrates a first energy state (e.g., ground state)|1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |3>. Therefore, the alkali metal atoms in the first Rydberg energy state |3> can be transparent with respect to light at the approximate frequency of the probe beam $OPT_{PRB}$.

However, example of FIG. 4 demonstrates the inclusion of the tuning beam $OPT_{TN}$ provided through the sensor cell 202. In the example of FIG. 4, the tuning beam $OPT_{TN}$ has a frequency that is approximately equal to an energy difference between the first Rydberg energy state |3> and an intermediate energy state |4>. As an example, the intermediate energy state |4> can have an energy that is significantly less than the first Rydberg energy state |3>.

As described above, the tuning beam $OPT_{TN}$ can result in the creation of mixed energy states |+> and |–> that can each be based on a combination of the first Rydberg state and the intermediate energy state. For example, the mixed energy state |+> can be based on a sum of the first Rydberg state and the intermediate energy state, as modified by a coefficient, and the mixed energy state |–> can be based on a difference of the first Rydberg state and the intermediate energy state, as modified by a coefficient. The mixed energy states |+> and |–> are created proximal to (e.g., approximately centered on) the energy level of the first Rydberg energy state |3>. In the graph 404, the mixed energy states |+> and |–> result in Autler-Townes splitting of the transparency peak of the alkali metal atoms in the frequency spectrum. Thus, the transparency peak demonstrated in the graph 304 in the example of FIG. 3 is split into a pair of Autler-Townes transparency peaks, demonstrated at 406, based on the creation of mixed energy states |+> and |–> resulting from the resonance of the tuning beam $OPT_{TN}$ relative to the energy difference between the first Rydberg state |3> and the intermediate energy state |4>. As described herein, the Autler-Townes pair of transparency peaks in the frequency spectrum can be well defined and detectable.

The graph 404 plots an intensity of the detection beam $OPT_{DET}$ as a function of frequency. In the example of FIG. 4, the graph 404 demonstrates an intensity of approximately 100% of the intensity of the detection beam $OPT_{DET}$, and thus substantially no absorption of photons of the probe beam $OPT_{PRB}$ by the alkali metal vapor. The intensity begins to decrease at a frequency $f_{s1}$ to an absorption peak at a frequency $f_{s2}$ corresponding to maximum absorption of the photons of the probe beam $OPT_{PRB}$ by the alkali metal vapor, and thus a minimum intensity of the detection beam $OPT_{DET}$. The minimum intensity is demonstrated at an inverse peak dotted line in the example of FIG. 4, which would correspond to maximum absorption of the photons of the probe beam $OPT_{PRB}$ absent the coupling beam $OPT_{CPL}$. However, based on the interaction of the alkali metal vapor with the probe beam $OPT_{PRB}$, the coupling beam $OPT_{CPL}$, and the tuning beam $OPT_{TN}$, the alkali metal vapor can exhibit transitions between the mixed energy states |+> and |–> and the intermediate Rydberg state |4>. Therefore, the alkali metal vapor can be substantially insensitive to absorption of the photons of the probe beam $OPT_{PRB}$ at each of two frequencies $f_{s3}$ and $f_{s4}$ that are approximately equal and opposite the maximum absorption frequency $f_{s2}$ on the frequency spectrum.

The diagram 400 thus demonstrates the effect of Autler-Townes splitting of the electromagnetically-induced transparency peak in response to the tuning beam $OPT_{TN}$ having a frequency that is approximately equal to the energy difference between the first Rydberg energy state |3> and the intermediate energy state |4>. As described in greater detail herein, the tuning beam $OPT_{TN}$ can be tuned (e.g., by frequency or intensity) via the tuning signal TUN to adjust the mixed energy states |+> and |–>. As a first example, by adjusting the frequency of the tuning beam $OPT_{TN}$ to detune the tuning beam $OPT_{TN}$ from the energy difference between the first Rydberg state |3> and the intermediate energy state |4>, the mixed energy states |+> and |–> can be shifted up or down in the energy diagram. As a second example, by adjusting the intensity of the tuning beam $OPT_{TN}$, the mixed energy states |+> and |–> can remain approximately centered on the first Rydberg energy state |3>, but the energy gap between the mixed energy states |+> and |–> can be increased or decreased. Accordingly, as described in greater detail herein, by adjusting the tuning beam $OPT_{TN}$, an external signal $RF_{EXT}$ can be detected based on monitoring a change in the Autler-Townes pair of transparency peaks in the frequency spectrum of the detection beam $OPT_{DET}$ (e.g., based on a change in the location of the Autler-Townes pair of transparency peaks in the frequency spectrum of the detection beam $OPT_{DET}$ relative to each other).

Referring back to the example of FIG. 2, the electrometer system 200 further includes a detection system 220 that is configured to monitor the detection beam $OPT_{DET}$ provided on the optical axis to detect the external signal $RF_{EXT}$. In the example of FIG. 2, the detection system 220 includes a photodetector 222 (e.g., a photodiode) and a detection processor 224. The photodetector 222 can monitor the intensity and/or phase of the detection beam $OPT_{DET}$ and generate an electric signal, demonstrated in the example of FIG. 2 as a voltage VDET that corresponds to the intensity of the detection beam $OPT_{DET}$. As described above, the tuning beam $OPT_{TN}$ can provide a defined pair of Autler-Townes frequency-spectrum transparency peaks associated with the alkali metal atoms in response to the tuning beam $OPT_{TN}$ having a frequency that is approximately equal to the energy difference between the first Rydberg state |3> and the intermediate energy state |4>.

The detection processor 224 can thus determine a change in the pair of Autler-Townes frequency-spectrum transparency peaks that correspond to the presence of the external signal $RF_{EXT}$. In the example of FIG. 2, the detection processor 224 is configured to provide the tuning signal TUN to adjust the tuning beam $OPT_{TN}$ (e.g., with respect to frequency or intensity), resulting in adjustment of the mixed energy states |+> and |->. Therefore, when the frequency of the external signal $RF_{EXT}$ is approximately equal to the energy difference between a second Rydberg energy state and one of the mixed energy states |+> and |->, the Autler-Townes frequency-spectrum transparency peaks can exhibit a change that can be detected by the detection system 220. The detection processor 224 can thus determine characteristics associated with the external signal $RF_{EXT}$. While the tuning signal TUN is demonstrated in the example of FIG. 2 as being generated by the detection processor 224, the tuning signal TUN can be provided from any of a variety of other sources to adjust the tuning laser 214.

Figure 5:
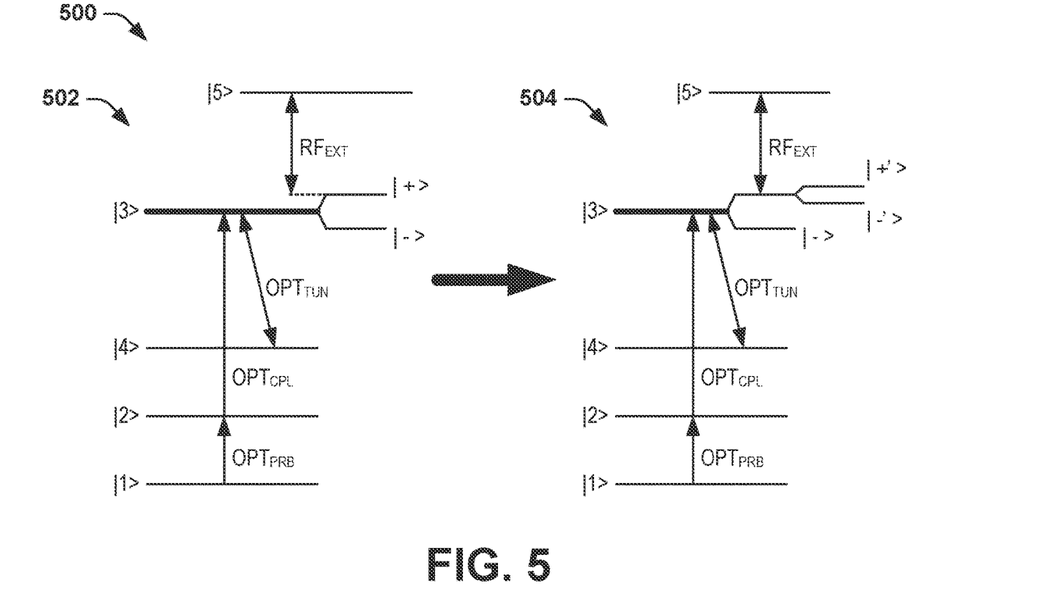
FIG. 5 illustrates an example of an energy state diagram.

FIG. 5 illustrates an example diagram 500 of energy state diagrams. The diagram 500 includes a first energy state diagram 502 and a second energy state diagram 504. The diagram 500 can correspond to optical detection in the electrometer system 200. Therefore, reference is to be made to the example of FIG. 2 in the following description of the example of FIG. 5.

The energy state diagram 502 demonstrates a first energy state (e.g., ground state) |1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |3>. Therefore, the alkali metal atoms in the first Rydberg energy state |3> can be transparent with respect to light at the approximate frequency of the probe beam $OPT_{PRB}$. The first energy state diagram 502 includes a second Rydberg energy state |5>, and demonstrates an external signal $RF_{EXT}$ having a frequency relative to the second Rydberg energy state |5>. In the example of FIG. 5, the frequency of the external signal $RF_{EXT}$ is less than an energy difference between the first and second Rydberg energy states |3> and |5>. Therefore, the external signal $RF_{EXT}$ cannot be detectable absent the tuning beam $OPT_{TN}$.

As described above, the tuning beam $OPT_{TN}$ is provided through the sensor cell 202. In the example of FIG. 5, the tuning beam $OPT_{TN}$ has a frequency that is approximately equal to an energy difference between the first Rydberg energy state |3> and an intermediate energy state |4>. As an example, the intermediate energy state |4> can have an energy that is significantly less than the first Rydberg energy state |3>. The tuning beam $OPT_{TN}$ results in the creation of the mixed energy states |+> and |-> that can each be based on a combination of the first Rydberg state and the intermediate energy state. The mixed energy states |+> and |-> result in Autler-Townes splitting of the transparency peak of the alkali metal atoms in the frequency spectrum, as described above.

As also described above, the tuning beam $OPT_{TN}$ can be tuned (e.g., by frequency or intensity) via the tuning signal TUN to adjust the mixed energy states |+> and |->. As a first example, by adjusting the frequency of the tuning beam $OPT_{TN}$ to detune the tuning beam $OPT_{TN}$ from the energy difference between the first Rydberg state |3> and the intermediate energy state |4>, the mixed energy states |+> and |-> can be shifted up or down in the energy diagram. As a second example, by adjusting the intensity of the tuning beam $OPT_{TN}$, the mixed energy states |+> and |-> can remain approximately centered on the first Rydberg energy state |3>, but the energy gap between the mixed energy states |+> and |-> can be increased or decreased. In the example of FIG. 5, by adjusting the tuning signal $OPT_{TN}$, the energy difference between the second Rydberg energy state |5> and the mixed energy state |+> can be tuned to be approximately equal to the frequency of the external signal $RF_{EXT}$.

The energy state diagram 504 demonstrates the resonance of the frequency of the external signal $RF_{EXT}$ with respect to the second Rydberg energy state |5> and the mixed energy state |+>. Therefore, the external signal $RF_{EXT}$ can be detected by the electrometer system 200. As described above, creation of the mixed energy states |+> and |-> results in splitting of the transparency peak, as demonstrated in the example of FIG. 3, into a pair of Autler-Townes transparency peaks, as demonstrated in the example of FIG. 4, in the frequency spectrum of the alkali metal atoms. As described above, the Autler-Townes transparency peaks can be detected by the detection system 220. In the energy state diagram 504, in response to the frequency of the external signal $RF_{EXT}$ being approximately equal to energy difference between the second Rydberg energy state |5> and the mixed energy state |+>, additional mixed energy states |+'> and |-'> are created. The additional mixed energy states |+'> and |-'> can each be a combination of the second Rydberg energy state and the mixed energy state |+>, similar to as described above.

The creation of the additional mixed energy states |+> and |-> results in further splitting of one of the pair of Autler-Townes transparency peaks. Therefore, the detection system 220 can detect the additional splitting of one of the pair of Autler-Townes transparency peaks to detect the external signal $RF_{EXT}$. Accordingly, the external signal $RF_{EXT}$ can be detected based on monitoring a change in the Autler-Townes pair of transparency peaks in the frequency spectrum of the detection beam $OPT_{DET}$.

The manner of detecting the external signal $RF_{EXT}$ is not limited to the example of FIG. 5. Other examples of stimulation to different Rydberg energy states and application of the tuning beam $OPT_{TN}$ are likewise possible.

Figure 6:
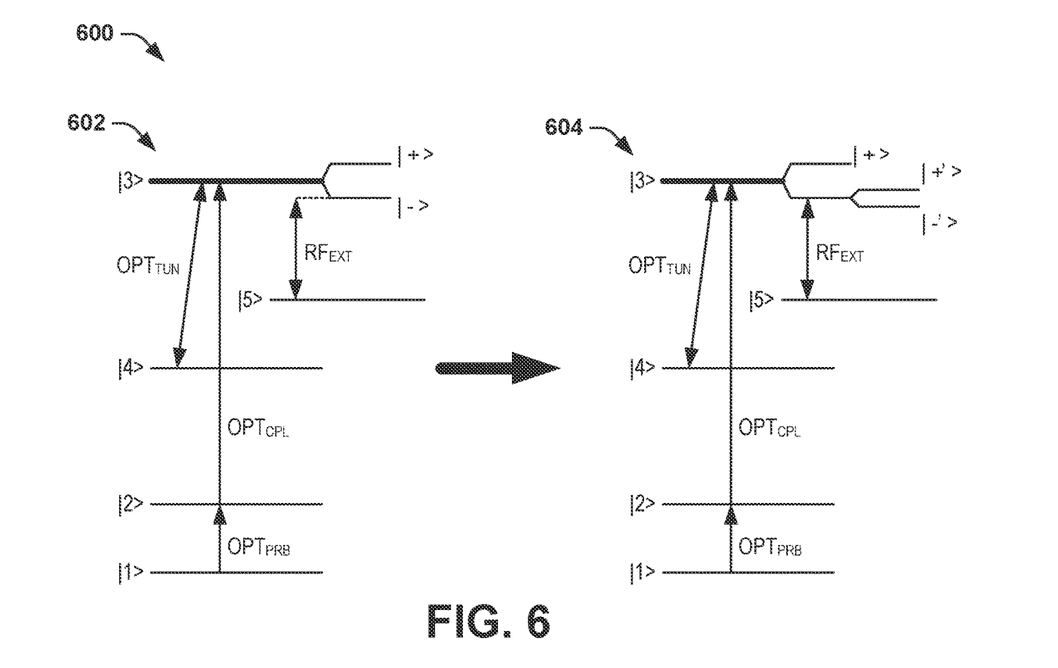
FIG. 6 illustrates another example of an energy state diagram.

FIG. 6 illustrates an example diagram 600 of energy state diagrams. The diagram 600 includes a first energy state diagram 602 and a second energy state diagram 604. The diagram 600 can correspond to optical detection in the electrometer system 200. Therefore, reference is to be made to the example of FIG. 2 in the following description of the example of FIG. 6.

The energy state diagram 602 demonstrates a first energy state (e.g., ground state) |1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |3>. Therefore, the alkali metal atoms in the first Rydberg energy state |3> can be transparent with respect to light at the approximate frequency of the probe beam $OPT_{PRB}$. The first energy state diagram 602 includes a second Rydberg energy state |5>. In the example of FIG. 6, the second Rydberg energy state |5> has an energy that is less than the first Rydberg energy state |3>. The first energy state diagram 602 also demonstrates an external signal $RF_{EXT}$ having a frequency relative to the second Rydberg energy state |5>. In the example of FIG. 6, the frequency of the external signal $RF_{EXT}$ is less than an energy difference between the first and second Rydberg energy states |3> and |5>. Therefore, the external signal $RF_{EXT}$ cannot be detectable absent the tuning beam $OPT_{TN}$.

As described above, the tuning beam $OPT_{TN}$ is provided through the sensor cell 202. In the example of FIG. 6, the tuning beam $OPT_{TN}$ has a frequency that is approximately equal to an energy difference between the first Rydberg energy state |3> and an intermediate energy state |4>. As an example, the intermediate energy state |4> can have an energy that is significantly less than the first Rydberg energy state |3>. The tuning beam $OPT_{TN}$ results in the creation of the mixed energy states |+> and |−> that can each be based on a combination of the first Rydberg state and the intermediate energy state. The mixed energy states |+> and |−> result in Autler-Townes splitting of the transparency peak of the alkali metal atoms in the frequency spectrum, as described above.

Similar to as described above in the example of FIG. 5, the tuning beam $OPT_{TN}$ can be tuned (e.g., by frequency or intensity) via the tuning signal TUN to adjust the mixed energy states |+> and |−>. In the example of FIG. 6, by adjusting the tuning signal $OPT_{TN}$, the energy difference between the second Rydberg energy state |5> and the mixed energy state |−> can be tuned to be approximately equal to the frequency of the external signal $RF_{EXT}$.

The energy state diagram 604 demonstrates the resonance of the frequency of the external signal $RF_{EXT}$ with respect to the second Rydberg energy state |5> and the mixed energy state |−>. Therefore, the external signal $RF_{EXT}$ can be detected by the electrometer system 200. As described above, creation of the mixed energy states |+> and |−> results in splitting of the transparency peak, as demonstrated in the example of FIG. 3, into a pair of Autler-Townes transparency peaks, as demonstrated in the example of FIG. 4, in the frequency spectrum of the alkali metal atoms. As described above, the Autler-Townes transparency peaks can be detected by the detection system 220. In the energy state diagram 604, in response to the frequency of the external signal $RF_{EXT}$ being approximately equal to energy difference between the second Rydberg energy state |5> and the mixed energy state |−>, additional mixed energy states |+'> and |−'> are created. The additional mixed energy states |+'> and |−'> can each be a combination of the second Rydberg energy state and the mixed energy state |−>, similar to as described above. Therefore, the detection system 220 can detect the additional splitting of one of the pair of Autler-Townes transparency peaks to detect the external signal $RF_{EXT}$. Accordingly, the external signal $RF_{EXT}$ can be detected based on monitoring a change in the Autler-Townes pair of transparency peaks in the frequency spectrum of the detection beam $OPT_{DET}$.

Figure 7:
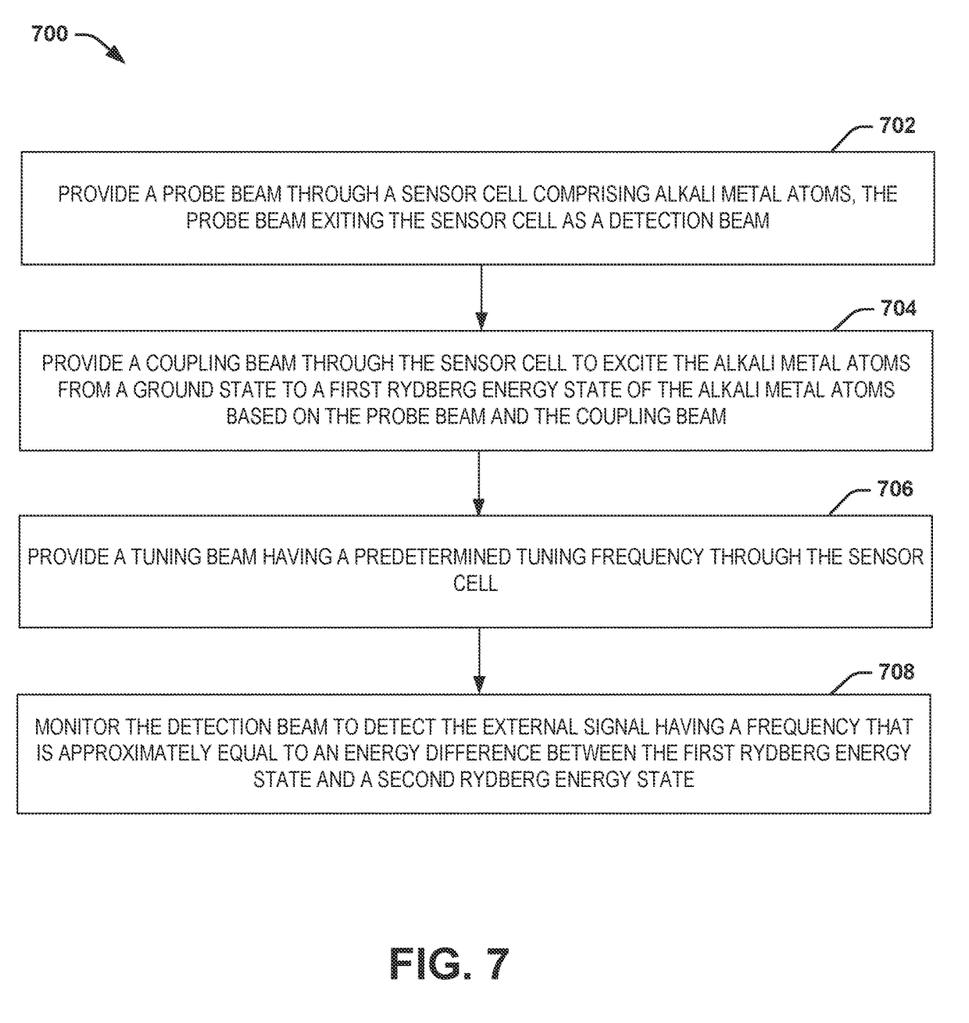
FIG. 7 illustrates a method for detecting an external signal via an electrometer system.

In view of the foregoing structural and functional features described above, a methodology in accordance with various aspects of the disclosure will be better appreciated with reference to FIG. 7. It is to be understood and appreciated that the method of FIG. 7 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 7 illustrates an example of a method 700 for detecting an external signal (e.g., the external signal RF ENT) via an electrometer system (e.g., the electrometer system 100). At 702, a probe beam (e.g., the probe beam $OPT_{PRB}$) is provided through a sensor cell (e.g., the sensor cell 102) comprising alkali metal atoms. The probe beam can exit the sensor cell as a detection beam (e.g., the detection beam $OPT_{DET}$). At 704, a coupling beam (e.g., the coupling beam $OPT_{CPL}$) is provided through the sensor cell to excite the alkali metal atoms from a ground state to a first Rydberg energy state (e.g., the first Rydberg energy state |3>) of the alkali metal atoms based on the probe beam and the coupling beam. At 706, a tuning beam (e.g., the tuning beam $OPT_{TN}$) having a predetermined tuning frequency is provided through the sensor cell. The predetermined tuning frequency can be approximately equal to an energy difference between the first Rydberg energy state and an intermediate energy state (e.g., the intermediate energy state 14>) of the alkali metal atom. At 708, the detection beam is monitored to detect the external signal having a frequency that is approximately equal to an energy difference between the first Rydberg energy state and a second Rydberg energy state (e.g., the second Rydberg energy state |5>).

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An electrometer system comprising:
a sensor cell comprising alkali metal atoms within;
an optical beam system configured to provide at least one optical beam through the sensor cell to provide a first Rydberg energy state of the alkali metal atoms, the at least one optical beam exiting the sensor cell as a detection beam;
a tuning laser configured to provide a tuning beam through the sensor cell, the tuning beam having a predetermined tuning frequency between the first Rydberg energy state and an intermediate energy state of the alkali metal atoms; and
a detection system configured to monitor the detection beam to detect an external signal having a frequency that is approximately equal to an energy difference between the first Rydberg energy state and a second Rydberg energy state based on monitoring the detection beam.

2. The system of claim 1, wherein the tuning beam is configured to generate a pair of mixed energy states associated with the first Rydberg state and the intermediate energy state, wherein the detection system is configured to detect the external signal based on a frequency difference between the second Rydberg energy state and one of the mixed energy states.

3. The system of claim 2, wherein the mixed energy states correspond to a respective pair of Autler-Townes frequency-spectrum transparency peaks, wherein the detection system is configured to detect the external signal in response to observing a change in the pair of Autler-Townes frequency-spectrum transparency peaks based on monitoring an intensity of the detection beam.

4. The system of claim 3, wherein the detection system comprises:
   a photodetector configured to monitor at least one of the intensity or phase of the detection beam and to generate a detection signal that corresponds to the intensity of the detection beam; and
   a detection processor configured to detect the change in the pair of Autler-Townes frequency-spectrum transparency peaks based on the detection signal.

5. The system of claim 2, wherein the tuning laser is adjusted by a tuning signal to adjust an energy difference between the respective one of the mixed energy states and the second Rydberg energy state to be approximately equal to the frequency of the external signal to detect the external signal.

6. The system of claim 5, wherein the tuning signal is provided to the tuning laser to adjust at least one of a frequency and an intensity of the tuning beam to adjust the mixed energy states.

7. The system of claim 5, wherein the detection system is configured to generate the tuning signal.

8. The system of claim 1, wherein the optical system comprises:
   a probe laser configured to generate a probe beam directed through the sensor cell in a first direction, the probe beam exiting the sensor cell as the detection beam; and
   at least one coupling laser configured to generate a respective at least one coupling beam directed through the sensor cell collinearly with the probe beam to provide the first Rydberg energy state of the alkali metal atoms.

9. The system of claim 7, further comprising optics configured to collimate the probe beam, the coupling beam, and the tuning beam to provide the probe beam, the coupling beam, and the tuning beam to be collinear on an optical axis with respect to each other, with the probe beam and the coupling beam being anti-parallel with each other, such that the detection system is configured to monitor the detection beam along the optical axis through the sensor cell to detect the external signal.

10. A method for detecting an external signal via an electrometer system, the method comprising:
    providing a probe beam through a sensor cell comprising alkali metal atoms, the probe beam exiting the sensor cell as a detection beam;
    providing a coupling beam through the sensor cell to excite the alkali metal atoms from a ground state to a first Rydberg energy state of the alkali metal atoms based on the probe beam and the coupling beam;
    providing a tuning beam having a predetermined tuning frequency through the sensor cell, the predetermined tuning frequency being approximately equal to an energy difference between the first Rydberg energy state and an intermediate energy state of the alkali metal atoms; and
    monitoring the detection beam to detect the external signal having a frequency that is approximately equal to an energy difference between the first Rydberg energy state and a second Rydberg energy state.

11. The method of claim 10, wherein providing the tuning beam comprises providing the tuning beam having the predetermined tuning frequency equal to the energy difference between the first Rydberg state and the intermediate energy state.

12. The method of claim 10, wherein providing the tuning beam comprises providing the tuning beam to generate a pair of mixed energy states associated with the first Rydberg state and the intermediate energy state, the method further comprising generating a tuning signal to adjust the mixed energy states to provide an energy difference between one of the mixed energy states and the second Rydberg energy state to be approximately equal to the frequency of the external signal to detect the external signal.

13. The method of claim 12, wherein generating the tuning signal comprises adjusting at least one of a frequency and an intensity of the tuning beam to adjust the mixed energy states based on the tuning signal.

14. The method of claim 12, wherein the mixed energy states correspond to a respective pair of Autler-Townes frequency-spectrum transparency peaks, wherein monitoring the detection beam comprises monitoring an intensity of the detection beam to observe a change in the pair of Autler-Townes frequency-spectrum transparency peaks.

15. The method of claim 10, wherein providing the probe beam, the coupling beam, and the tuning beam comprises providing the probe beam, the coupling beam, and the tuning beam through a set of optics configured to collimate the probe beam, the coupling beam, and the tuning beam to provide the probe beam, the coupling beam, and the tuning beam to be collinear with respect to each other on an optical axis, such that the detection system is configured to monitor the detection beam along the optical axis through the sensor cell to detect the external signal.

16. An electrometer system comprising:
    a sensor cell comprising alkali metal atoms within;
    a probe laser configured to generate a probe beam directed through the sensor cell in a first direction, the probe beam exiting the sensor cell as the detection beam;
    a coupling laser configured to generate a coupling beam directed through the sensor cell collinearly and anti-parallel with the probe beam to provide a first Rydberg energy state of the alkali metal atoms;
    a tuning laser configured to provide a tuning beam through the sensor cell, the tuning beam having a predetermined tuning frequency between the first Rydberg energy state and an intermediate energy state of the alkali metal atoms; and
    a detection system configured to monitor the detection beam to detect an external signal having a frequency that is approximately equal to an energy difference between the first Rydberg energy state and a second Rydberg energy state based on monitoring the detection beam.

17. The system of claim 16, wherein the tuning beam is configured to generate a pair of mixed energy states associated with the first Rydberg state and the intermediate energy state, wherein the detection system is configured to generate a tuning signal to adjust the mixed energy states to provide an energy difference between one of the mixed energy states and the second Rydberg energy state to be approximately equal to the frequency of the external signal to detect the external signal.

18. The system of claim 17, wherein the tuning signal is provided to the tuning laser to adjust at least one of a frequency and an intensity of the tuning beam to adjust the mixed energy states.

19. The system of claim 17, wherein the mixed energy states correspond to a respective pair of Autler-Townes frequency-spectrum transparency peaks, wherein the detection system is configured to detect the external signal in response to observing a change in the pair of Autler-Townes frequency-spectrum transparency peaks based on monitoring an intensity of the detection beam.

20. The system of claim 16, further comprising optics configured to collimate the probe beam, the coupling beam, and the tuning beam to provide the probe beam, the coupling beam, and the tuning beam to be collinear on an optical axis with respect to each other, such that the detection system is configured to monitor the detection beam along the optical axis through the sensor cell to detect the external signal.

* * * * *